United States Patent [19]

Ohsawa

[11] Patent Number: 5,673,271

[45] Date of Patent: Sep. 30, 1997

[54] HIGH SPEED PATTERN GENERATOR

[75] Inventor: Toshimi Ohsawa, Saitama-ken, Japan

[73] Assignee: Advantest Corporation, Tokyo, Japan

[21] Appl. No.: 515,716

[22] Filed: Aug. 16, 1995

[30] Foreign Application Priority Data

Aug. 19, 1994 [JP] Japan ................................. 6-218112
Aug. 22, 1994 [JP] Japan ................................. 6-220976

[51] Int. Cl.⁶ ...................................................... G01R 31/28
[52] U.S. Cl. ........................ 371/21.1; 371/27; 395/421.07
[58] Field of Search .............................. 371/21.1, 25, 27, 371/22.1, 21.3, 25.1; 395/550, 421.07; 324/158 R, 73 R

[56] References Cited

U.S. PATENT DOCUMENTS

| | | | |
|---|---|---|---|
| 4,797,886 | 1/1989 | Imada | 371/27 |
| 4,862,460 | 8/1989 | Yamaguchi | 371/27 |
| 4,958,345 | 9/1990 | Fujisaki | 371/21.3 |
| 5,142,223 | 8/1992 | Higashino et al. | 324/158 R |
| 5,313,622 | 5/1994 | Truchard et al. | 395/550 |
| 5,321,702 | 6/1994 | Brown et al. | 371/27 |
| 5,432,797 | 7/1995 | Takano | 371/27 |

*Primary Examiner*—Robert W. Beausoliel, Jr.
*Assistant Examiner*—Nadeem Iqbal
*Attorney, Agent, or Firm*—Knobbe, Martens, Olson & Bear, LLP

[57] ABSTRACT

A high speed pattern generator is disclosed that can generate a test pattern at high speed for an electronics device to be tested, such as a flash memory where the test flow varies depending on the test results. The pattern generator includes an address generator for generating address data of the test pattern and the address generator has a pipeline wherein a plurality of instructions are executed in sequential stages at the same time, an operation control memory that stores part of the instructions to be processed in the address generator, a save register that stores branch destination data in a sequence control section in response to a match signal from a comparator wherein the sequence control section accesses the operation control memory to read the instructions, and an inhibit gate that prevents an initial clock generator from generating an initial clock for driving the pipeline in the address generator in response to the match signal.

5 Claims, 12 Drawing Sheets

1
HIGH SPEED PATTERN GENERATOR

FIELD OF THE INVENTION

This invention relates to a test pattern generator for testing an electronics device at high speeds, and more particularly, to a high speed pattern generator that can generate a test pattern for an electronics device such as a flash memory whose test sequence varies in accordance with the test results and multiple operations for writing and erasing are required.

BACKGROUND OF THE INVENTION

Generally, a semiconductor test system is required to test a device to be measured at high speeds and to generate test patterns for this purpose.

Figure 6:
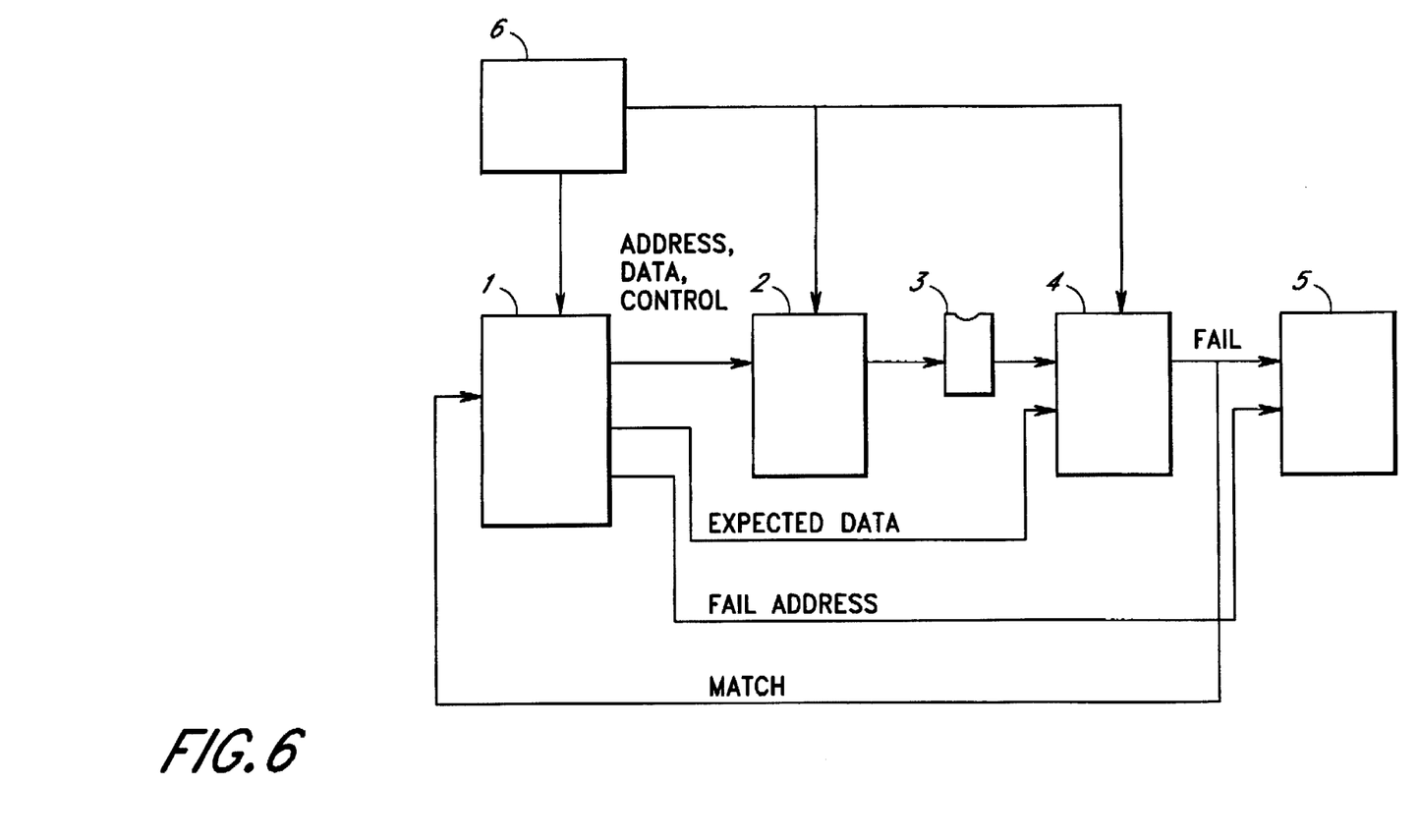
FIG. 6 is a composition example of a semiconductor testing system that tests the quality of a device to be measured.

The composition of the semiconductor test system that tests the quality of a device to be measured is shown in FIG. 6. FIG. 6 is an example where the device to be measured is memory. Address, data and control signals from a pattern generator 1 for memory to be tested are supplied to a waveform shaper 2. These signals are shaped in the waveform shaper 2 and supplied to memory 3 to be tested and the data is written therein.

Next, data retrieved from the memory 3 to be tested is compared at a logical comparator 4 with an expected value signal output from the pattern generator 1. An output of the logical comparator 4 indicates whether or not the expected value signal agrees with the output of the memory to be tested and is called a match signal. This match signal feeds back to the pattern generator 1 and provides conditions for determining the pattern to be generated next.

Fail memory 5 stores fail information for each address by a fail signal output from the logical comparator 4, which is equivalent to the match signal, and an FM address signal supplied from the pattern generator 1. The above series of operation is all synchronized with a clock applied to each section from a timing generator 6.

Figure 7:
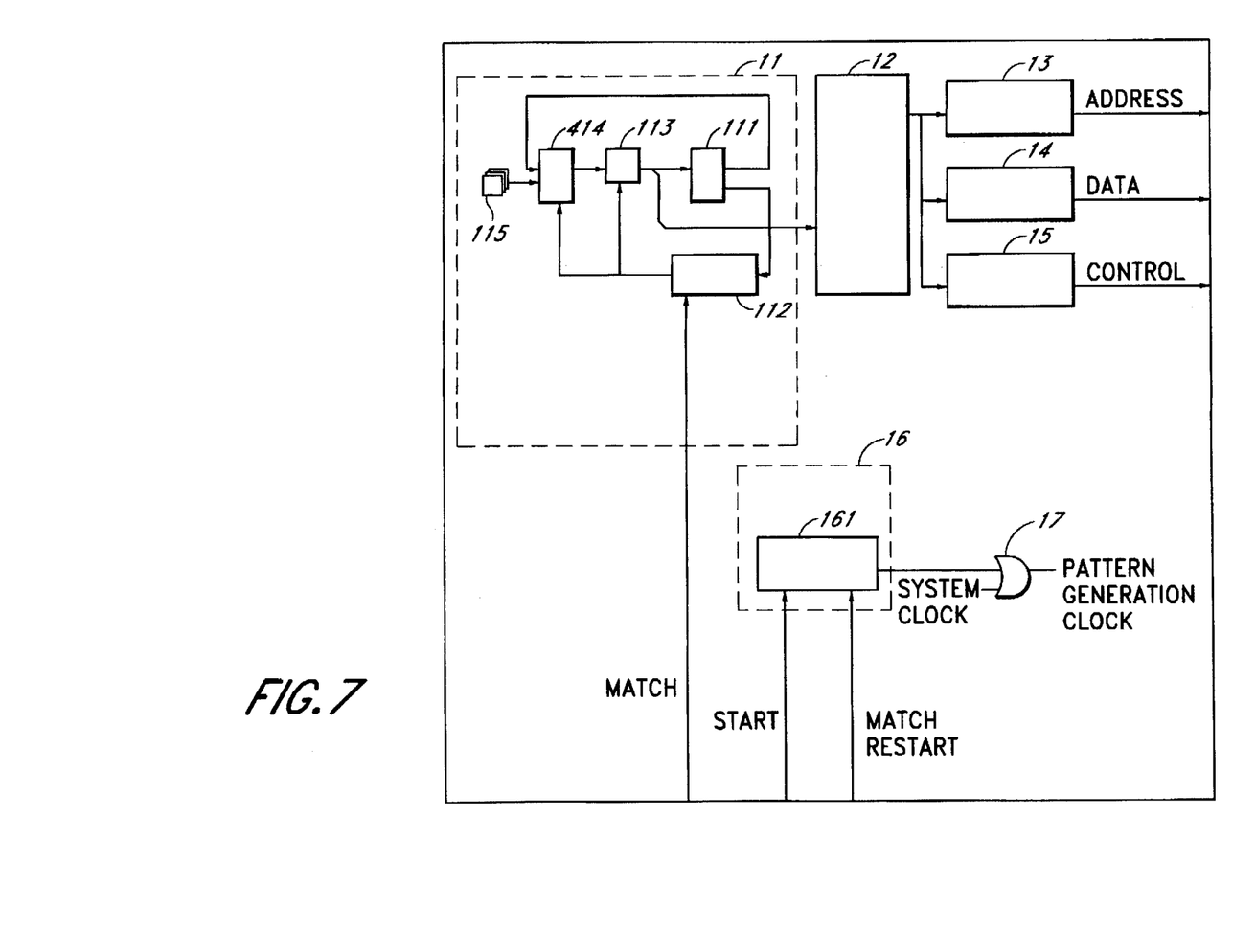
FIG. 7 is a block diagram of one example of the conventional pattern generator.

FIG. 7 illustrates a block diagram of one example of a conventional pattern generator. Operation control memory 12 is accessed by data output from a sequence control section 11. An output of the operation control memory 12 is applied to an address generating section 13, data generating section 14, control signal generating section 15, which generate an address signal, data and expected value signals and control signal, respectively.

In the sequence control section 11, data stored in the sequence control memory are decoded by a decode section 112 and are applied to a sequencer 113 so as to increment or hold, load data being read from a register 115 or newly load data being read from the sequence control memory 111. The operation control memory 12 is accessed and operation controls of addresses and pattern data, etc. are performed by the output data of the sequencer 113.

Figure 8:
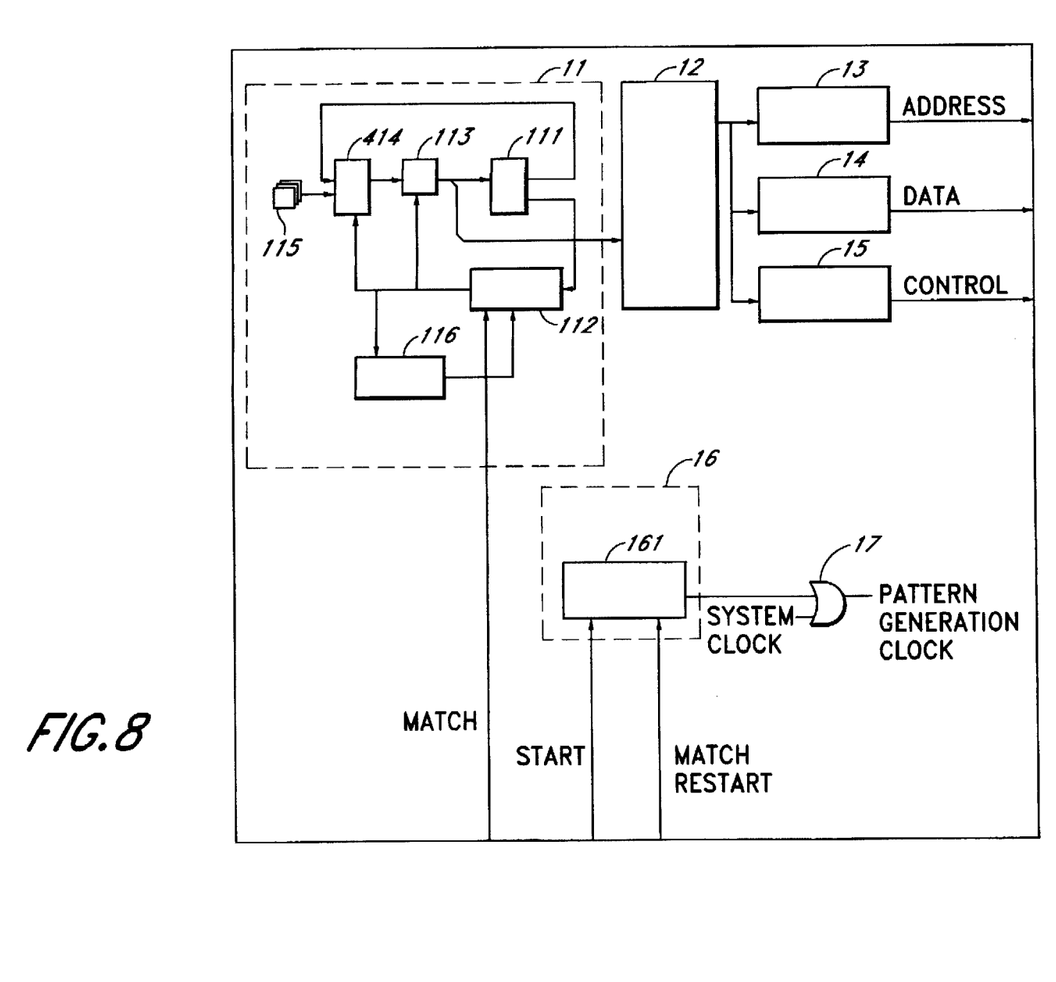
FIG. 8 is a block diagram of another conventional pattern generator.

Another conventional example is shown below:

FIG. 8 illustrates a block diagram of another conventional pattern generator. The operation control memory 12 is accessed by data output from the sequence control section 11. An output of the operation control memory 12 is applied to the address generating section 13, data generating section 14, control signal generating section 15, which generates an address signal, data and expected value signals and control signal respectively.

In the sequence control section 11, data stored in the sequence control memory is decoded by the a decode section 112 and is applied to the sequencer 113 so as to increment or hold, load data being read from the register 115 or newly load data being read from the sequence control memory 111. Furthermore, depending on a command, there is a case where the sequencer 113 is held by the number of counts set for a loop counter 116. The operation control memory 12 is accessed and operation controls such as addresses and pattern data, etc. are performed by the output data of the sequencer 113.

In the above each embodiment, the pattern generator 1 is required to generate the address, pattern data, and control signals to be applied to the device 3 at high speeds. The reason for the high speed to be required is explained by using the case of the address generation as an example.

Figure 9:
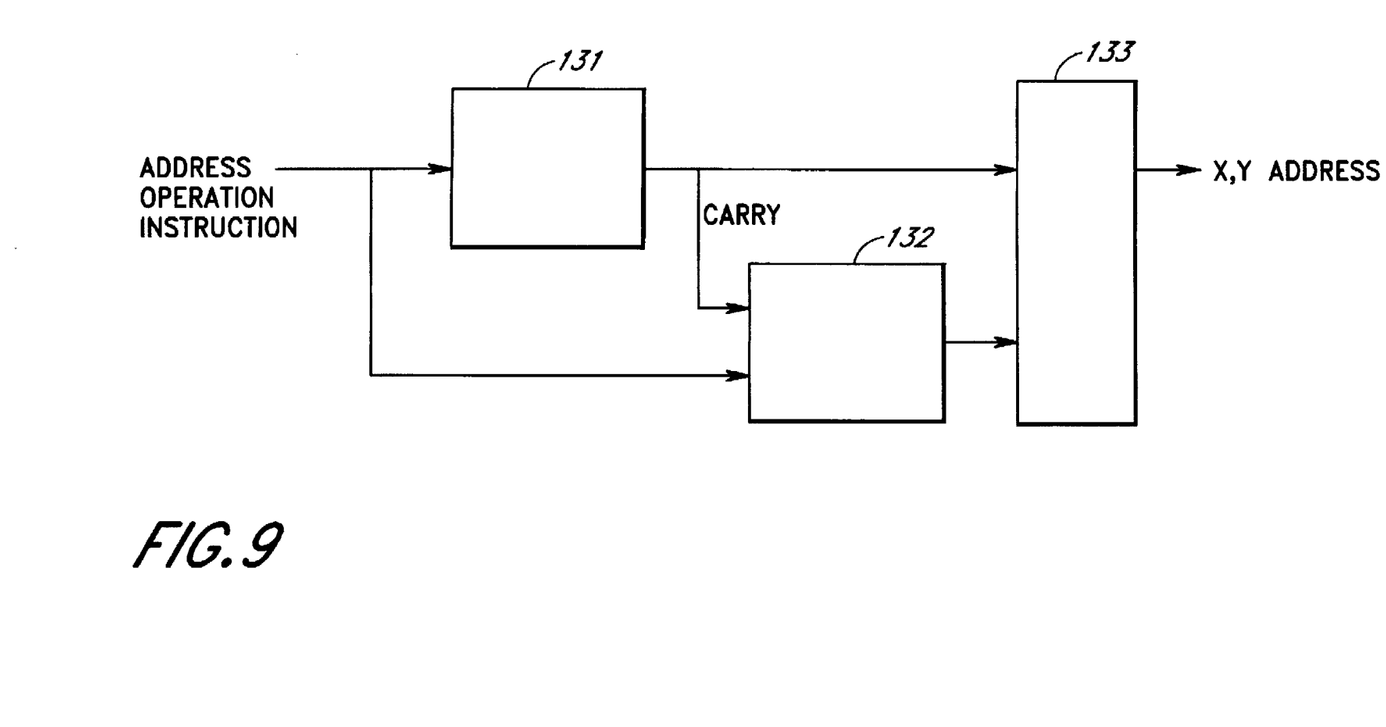
FIG. 9 is a block diagram of the address generation section 13.

FIG. 9 shows a block diagram of the address generation section 13. The address generation section 13 is composed of an X address generation section 131, Y address generation section 132, address conversion section 133, etc. The X and Y address generation sections perform operations by commands output from the operation control memory 12. In addition, the X and Y addresses can be linked together, and the Y address generation section 132 is controlled by a carry from the X address generation as well. The address generated from each X and Y address generation section enters the address conversion section 133 where the logical address is converted to the physical address and is output.

Figure 10:
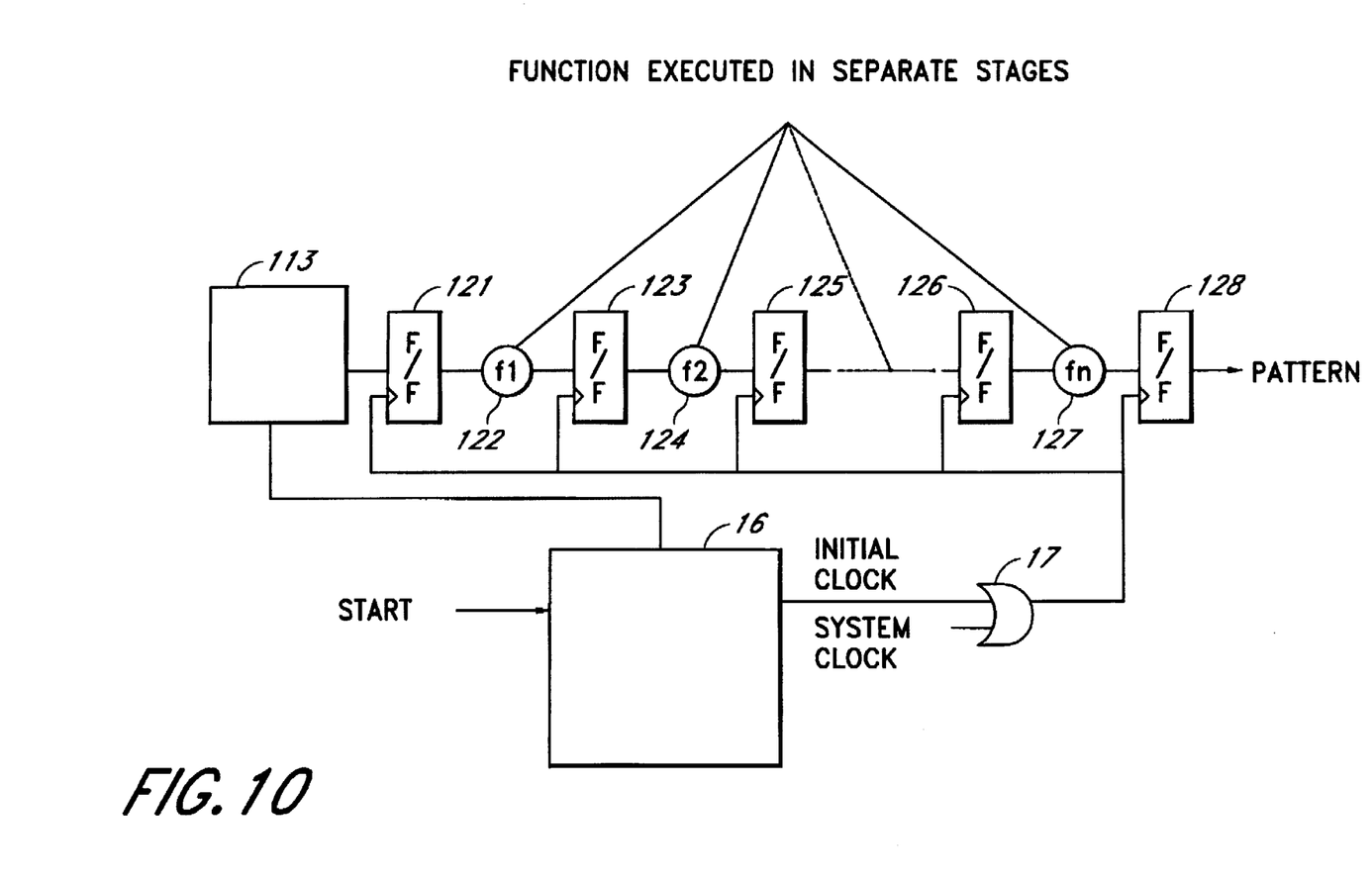
FIG. 10 is an example of dividing operations by the pipeline structure.

As the above series of operations is difficult to perform in one test cycle, generally, a multiple staged pipeline structure is employed and preprocessing is performed. FIG. 10 shows an example of dividing operations by the pipeline structure. As shown in FIG. 10, the address operations are processed by dividing into multiple cycles. In this case, as it takes multiple cycles in order to generate the address to be applied to the device 3 to be measured, the address operation is preprocessed for the cycles.

This pipeline structure is operated by supplying a system clock through an OR gate 17. In addition, if the initialization of the pipeline structure is required, the initial clock is supplied from a start/stop control section 16 by the start signal from the system bus. Furthermore, at a command (hereinafter referred to as the match command) which determines whether or not the device output and the expected value are agreed upon, the initial clock is supplied from the start/stop control section 16 by the match restart signal from the timing generator 6 as well.

Figure 11:
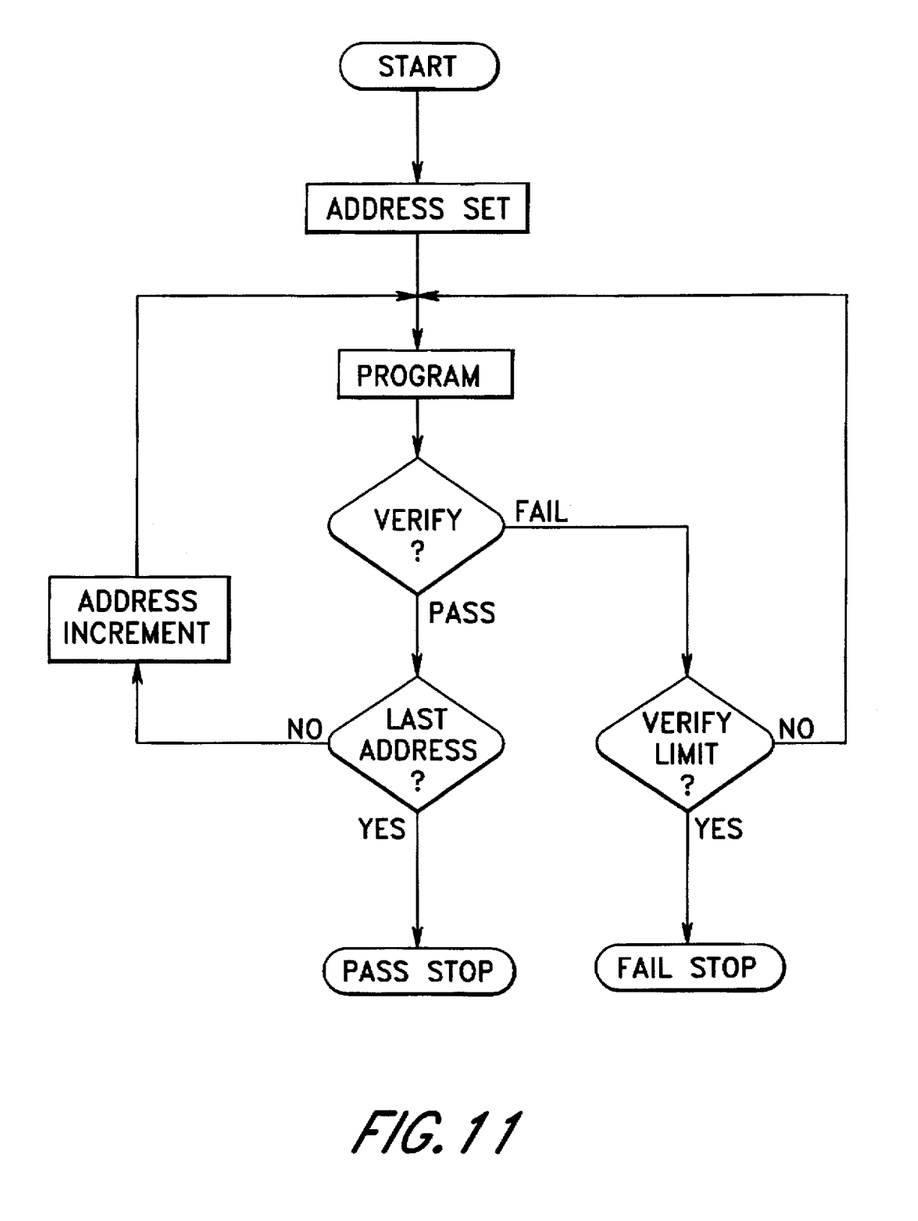
FIG. 11 is a flow chart of the case where the address of flash memory is written/read sequentially.

In the case of a device such as flash memory where the test flow varies, the above preprocessing can not be performed due to the following reason. FIG. 11 shows a flow chart for writing/reading the address in sequence for flash memory. As shown in FIG. 11, in the case of flash memory, the test flow changes after the verification depending on whether the verification result is pass or fail. That is, in the case of flash memory, it is different from a device with the standard and uniform test flow, and the preprocessing cannot be performed because the pattern generation sequence varies due to the output result of the device to be measured.

For this reason, for a case where the device with a varying test flow is measured, the following special processes are performed.

(1) The sequencer 113 is held by the command (hereinafter referred to as the match command) which determines whether or not the device 3 output and the expected value are agreed upon.

(2) Retrieval from the device after a few pipeline stages in the pattern generator is performed, and the result, i.e. the branch destination of the sequencer is determined by the match signal. That is, the test flow of either advancing to the next address or once again writing at the same address after the verification in FIG. 11 is determined.

(3) The start/stop control section 16 generates the initial clock from the initial clock generator 161 by the match restart signal from the timing generator at a time when the match signal is returned to the pattern generator similar to the start time from the system bus.

(4) The next pattern is applied to the device 3 by refilling the pipeline by the above initial clock.

Figure 5:
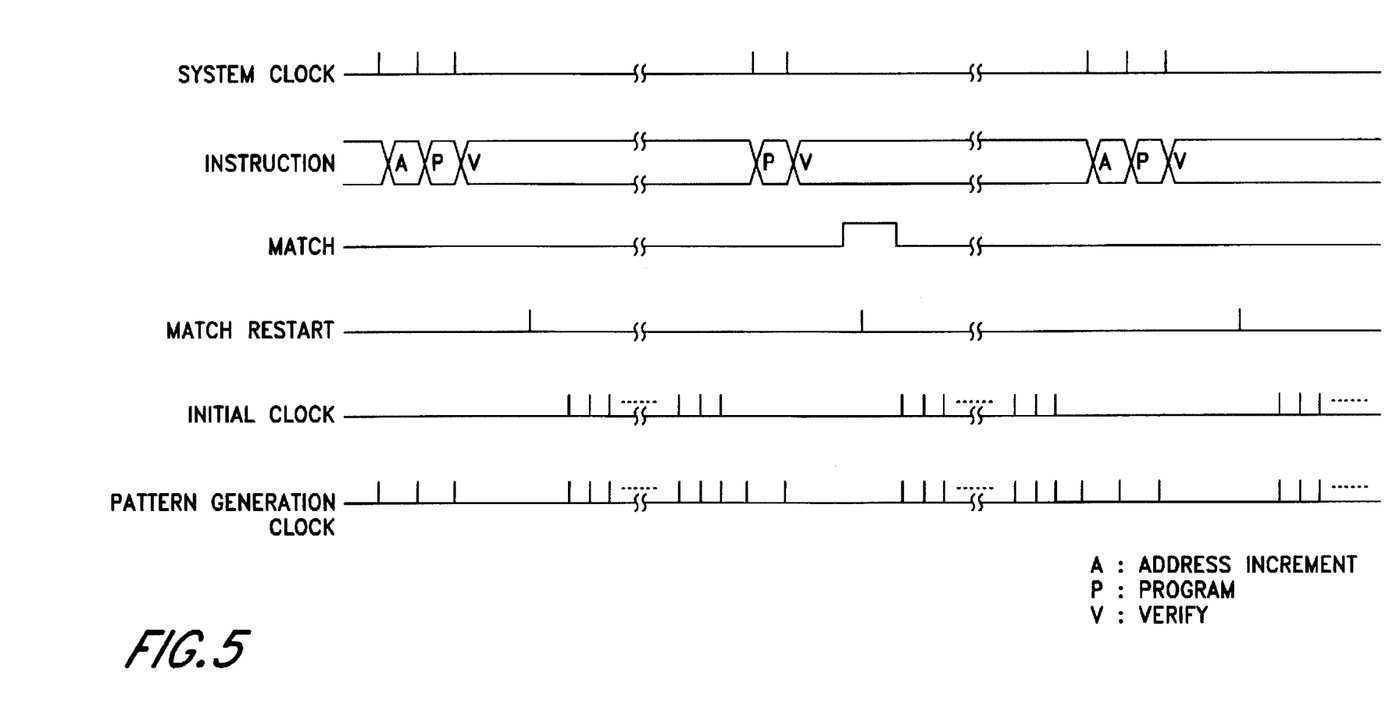
FIG. 5 is a timing chart by the conventional pattern generator.

FIG. 5 shows a timing chart by the conventional pattern generator. In this way, even when the match signal is either "0" or "1" at the match command, the operation rate must be delayed because the pipeline initialization is always performed. Hence, there is a shortcoming of increased test time.

SUMMARY OF THE INVENTION

It is an object of the present invention to provide a high speed pattern generator that can eliminate these shortcomings and test a device to be measured such as flash memory where multiple operations for writing and erasing are required, the number of operations are not constant and the test flow varies.

Figure 1:
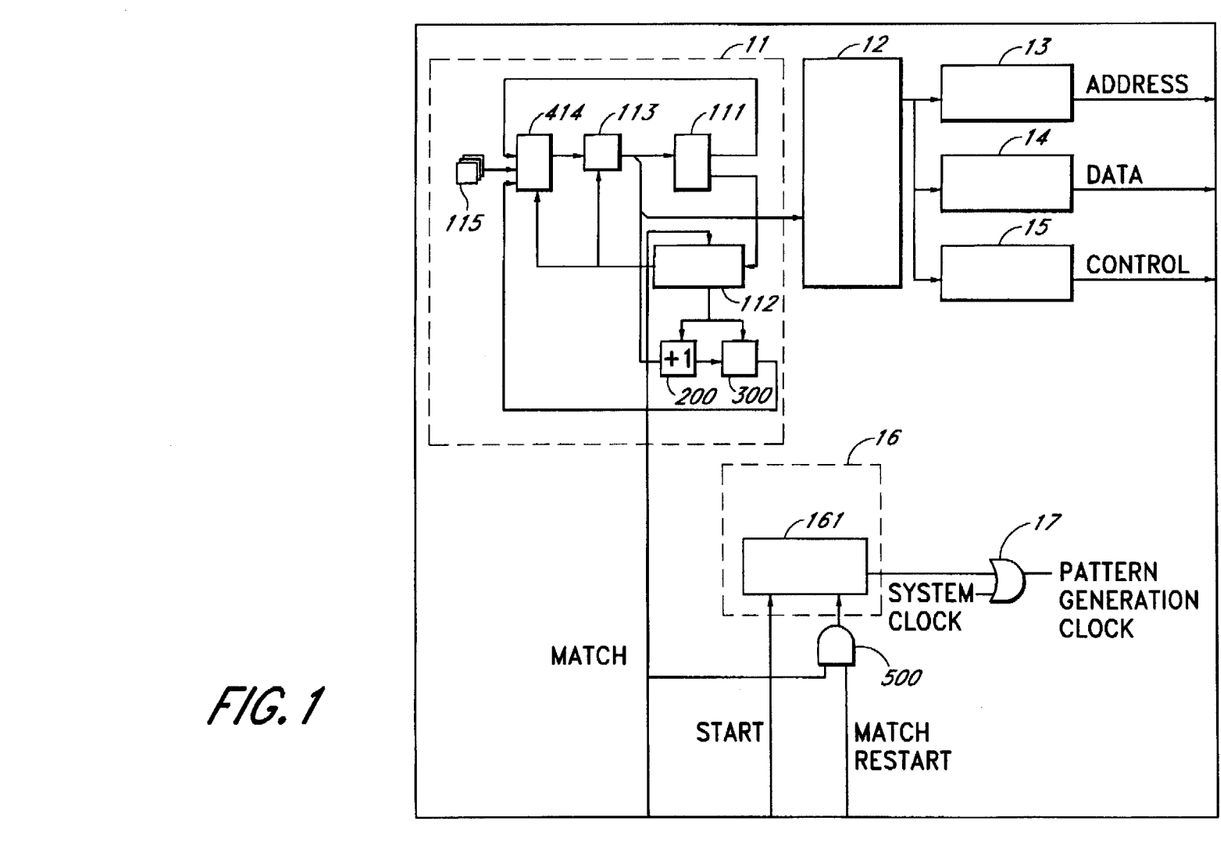
FIG. 1 is a block diagram of the pattern generator of the first embodiment of this invention.

In accordance with the first embodiment of this invention, in the pattern generator that tests a device to be measured as shown in FIG. 1, a save register 300 that stores a branch destination data in the sequence control section 11 which outputs data to the operation control memory 12 in response to the match signal from the logical selector 4 is arranged. The high speed pattern generator is composed by arranging an inhibit gate 500 that prevents an initial clock generator 161 from generating the initial clock in response to the match signal.

The above save register 300 can be composed of one that stores the output data of the incrementer 200 which increments the output data of the sequencer 113 by one and provides storage data to the selector 414 that selects data to be loaded to the sequencer 113.

In addition, the above inhibit gate 500 can be composed of an AND gate 500 where the match restart signal from the timing generator 6 is applied to its input terminal 1, the match signal is applied to the other input terminal and its output is given into the initial clock generation section 161.

In accordance with this invention, the sequence control section 11 stores the output value of sequencer 113 incremented by one data in the save register 300 when the match command is executed. Next, the sequencer 113 executes PROGRAM and VERIFY repeatedly, which are the loop of the match command, by assuming the sequencer can not find the matching. Then, VERIFY is performed after a few pipeline stages in the pattern generator. When the result is unmatched, the match restart signal from the timing generator 6 is inhibited by the AND gate 500 as the match signal is "0." Therefore, no initial clock from the start/stop control section 16 is generated. Next, when the matching result is pass, AND for the match restart signal and match signal is obtained at the AND gate 500 and the initial clock is generated at the start/stop control section 16 and the pipeline is refilled. Next, in the sequence control section 11, when the match signal is "1," the data stored in the save register 300 is loaded into the sequencer 113 via the selector 414 and exited from the match command loop and the next command is executed.

In this way, when the match is not found, the pipeline initialization is not performed and the pattern generator operation clock is generated once. Then, only when the match is found, the pipeline initialization is performed. Therefore, the testing can be sped up in comparison with the conventional system.

Figure 3:
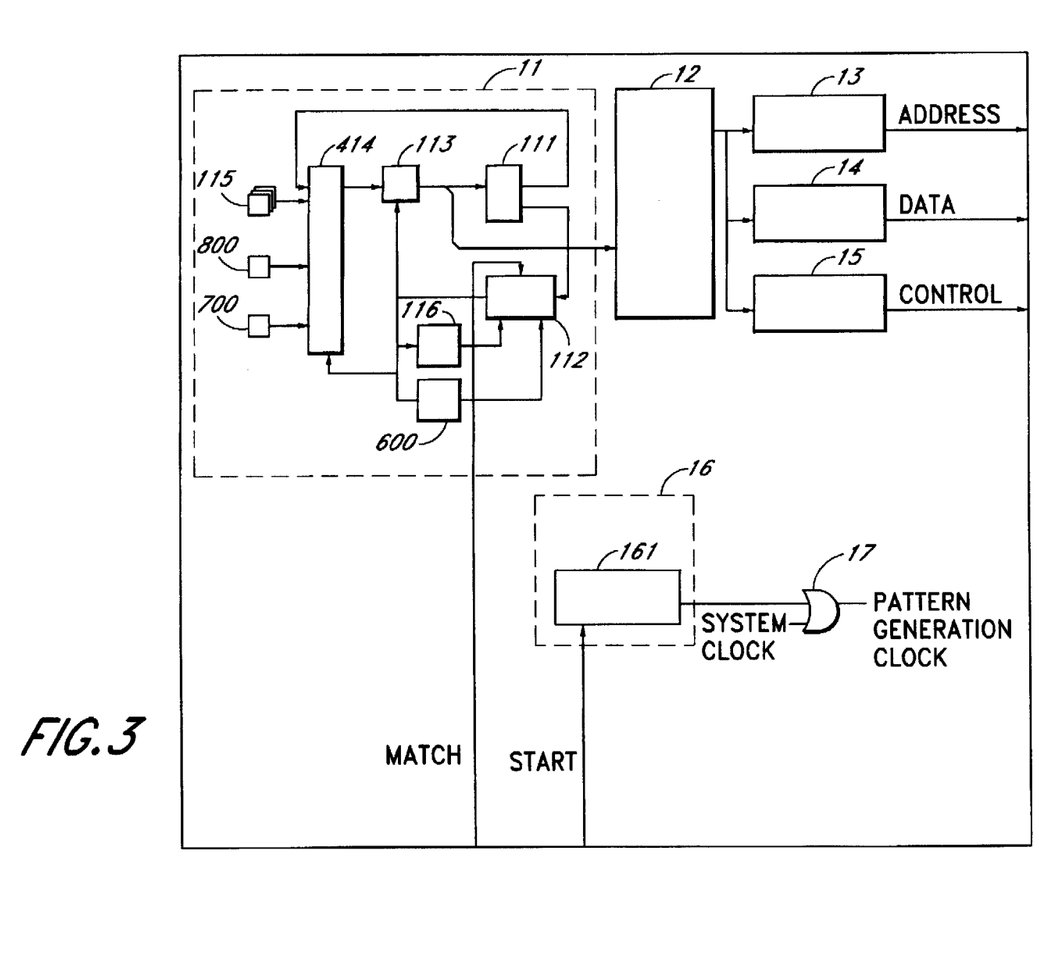
FIG. 3 is a block diagram of the pattern generator of the second embodiment of this invention.

In accordance with the second embodiment of this invention, in the pattern generator that tests a device to be measured as shown in FIG. 3, a match loop counter 600 that counts the number of repeated VERIFY is arranged in the sequence control section 11 which outputs data to the operation control memory 12 when the match signal from the logical comparator 4 is "0". The first register 800 that stores a branch address when the VERIFY count exceeds a predetermined limit is arranged. The second register 700 that stores an address branched from the sequencer 113 when the match signal is "1" is arranged. The high speed pattern generator further includes a selector 414 that loads the output from each register (700, 800) to the sequencer 113.

Alternatively, the above high speed pattern generator can be composed by performing the refilling operation of the pipeline structure of each operation section in the pattern generator 1 at the match command by arranging only a system clock means 17 without the match restart signal from the timing generator 6.

In accordance with this invention, firstly, the initial address is set, then WRITE PROGRAM COMMAND, WRITE PROGRAM, DURATION, WRITE PROGRAM VERIFY COMMAND, DURATION, and VERIFY steps are executed. Next, the pattern generator advances to a loop where the VERIFY result is FAIL and VERIFY limit is NO in the sequence in FIG. 12 and executes in sequence regardless whether the match signal is "1" or "0." As long as the match is not found, the above operation is repeated. When it exceeds the VERIFY limit, the data of the BAR register 800 is loaded to the selector 414 via the sequencer 113 and the pattern generator is completed as FAIL STOP.

Figure 12:
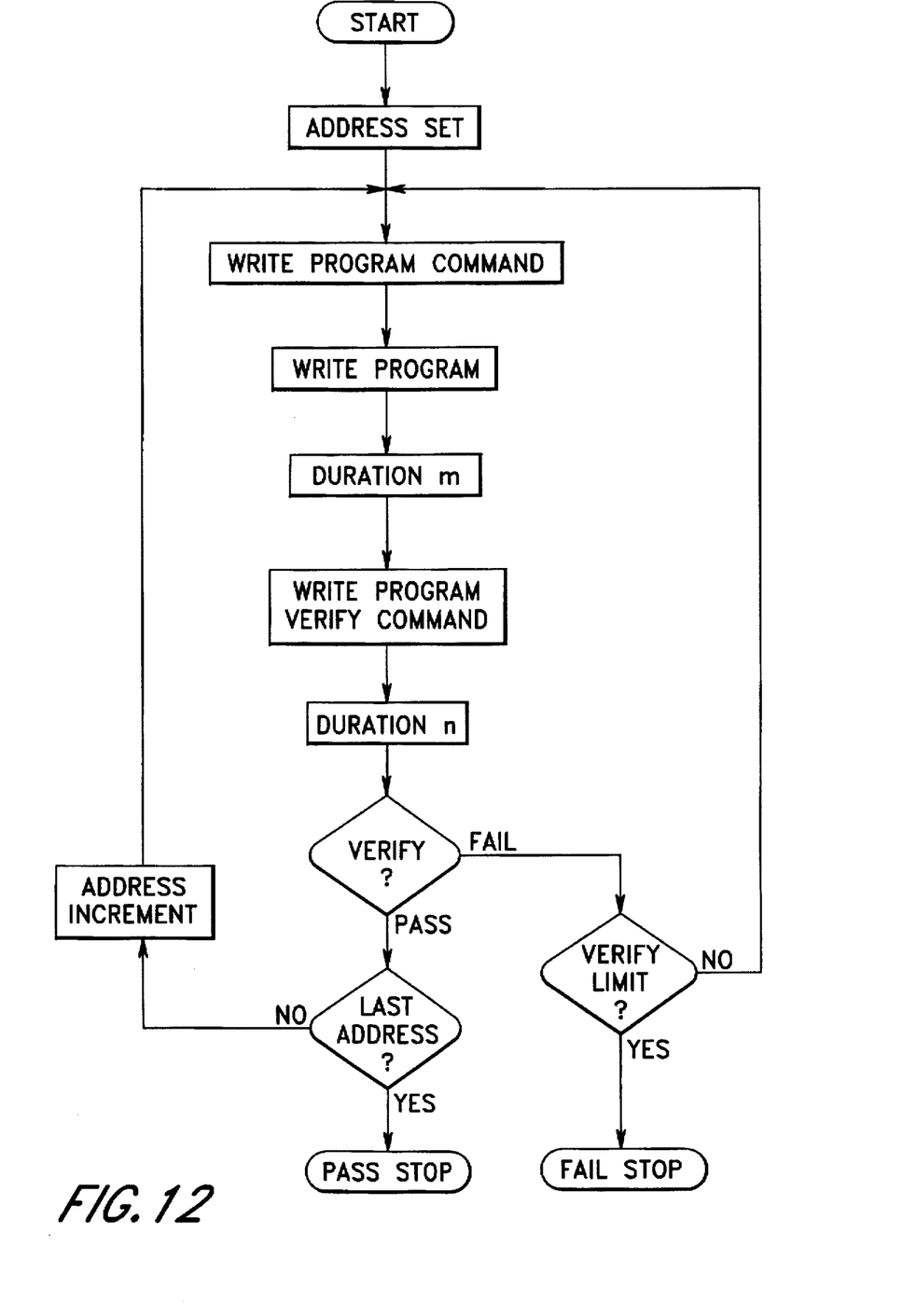
FIG. 12 is a detailed flow chart of the flash memory testing.

When the match is found, the following operation is performed. When the match signal enters the decode section 112, the data of the MJP register 700 is loaded into the sequencer 113 via the selector 414. At this instance, the match loop counter 600 is initialized at the same time. Here, if the loop counter 116 is not zero, i.e. the test address is not the final address, operand data is loaded into the sequencer 113 and a series of PROGRAM/VERIFY sequence is generated continuously. At this moment, the address signal is incremented by the address generator 13. If the loop counter 116 is zero, the sequencer 113 is incremented by one and the pattern generator is completed as PASS STOP.

In this way, when the match is found, the sequence is changed. Hence, the pipeline in the pattern generator must be refilled. In this case, as the match signal is just returned to the duration cycle, the pipeline is refilled using the system clock for DURATION.

In this way, in accordance with this invention, when the match is not found in testing flash memory and the like, the next command execution advances without waiting the VERIFY result, and the pipeline initialization is not performed. Therefore, the testing can be sped up in comparison with the conventional system. Furthermore, when the match is found, the pipeline initialization is performed using the system clock for the duration cycle. In addition, traditionally, the match restart signal provided from the timing generator 6 to the start/stop control section 16 becomes unnecessary and is not used. Hence, it becomes simpler in composition in comparison with the conventional system.

DETAILED DESCRIPTION OF THE PREFERRED EMBODIMENT

The first embodiment of this invention is explained by referring to the figures.

FIG. 1 is a block diagram of the pattern generator of the first embodiment by this invention. As shown in FIG. 1, the incrementer 200 that increments the output data of the match cycle sequencer 113 by one is arranged in the sequence control section 11. The save register 300 that stores the output data of the incrementer 200 is arranged. Further, the selector 414 that loads the output data of the save register 300 to the sequencer 113 is arranged.

In the start/stop control section 16, when the match signal is zero, the inhibit gate that prevents the initial clock generation section 161 from generating the initial clock is arranged. Therefore, the AND gate 500 where the match restart signal from the timing generator 6 is applied to its input terminal 1 and the match signal is applied to the other input terminal is arranged. An output of the AND gate is given into the initial lock generator 161. The pattern generator by this invention is composed in this manner.

It operates as follows:

(1) In the sequence control section 11, when the match command is executed, the data of the sequencer 113 incremented by one is stored in the save register 300. This PLUS 1 address indicates a branch destination when the match signal is 1.

(2) The sequencer 113 executes PROGRAM and VERIFY repeatedly, which are the loop of the match command, by assuming the sequencer can not find the matching. Hence, the result of the VERIFY performed after a few pipeline stages in the pattern generator no longer need to wait as the conventional way.

(3) VERIFY after a few pipeline stages in the pattern generator is performed. If the result is unmatched, as the match signal is "0," the match restart signal from the timing generator 6 is inhibited by the AND gate 500. Hence, the initial clock from the start/stop control section 16 is not generated. Therefore, the next command is executed as it is. In this case, as the sequencer is not held, the command when the match is not found is filled in the pipeline.

(4) When the match result is pass, AND for the match restart signal and match signal is obtained by the AND gate 500, and the initial clock is generated in the start/stop control section 16 to fill in the pipeline with new commands.

(5) In the sequence control section 11, when the match signal is "1," the data stored in the save register 300 is loaded into the sequencer 113 via the selector 414 and left from the loop, and the next command is executed.

Figure 2:
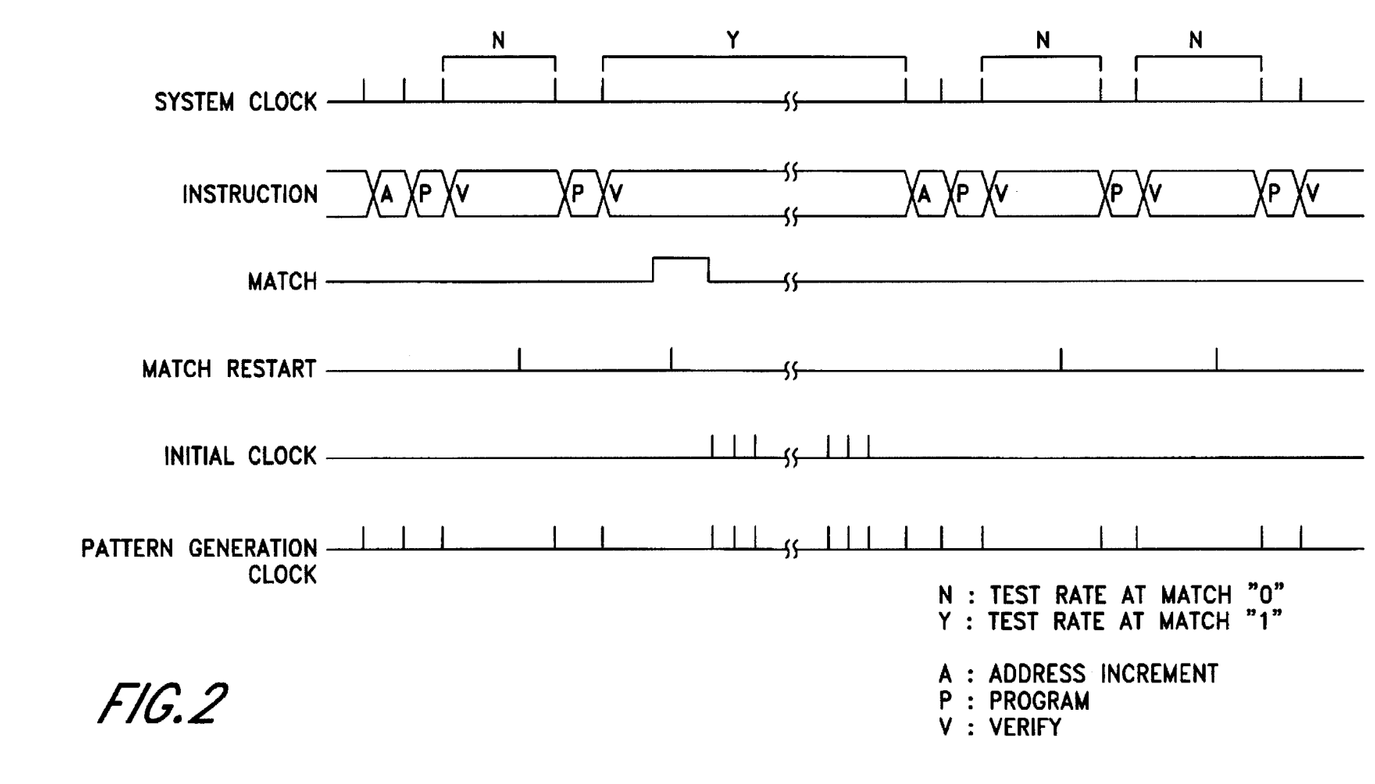
FIG. 2 is a timing chart by the first embodiment of this invention.

FIG. 2 indicates the timing chart of the first embodiment of this invention. In accordance with the first embodiment, in testing flash memory and the like, when the match is not found, the pattern generator operation clock is generated once without performing the pipeline initialization. Whereas only when the match is found, the pipeline initialization is performed. Therefore, the testing can be sped up in comparison with the conventional system.

The second embodiment of this invention is explained by referring to the figures.

FIG. 3 is a block diagram of the pattern generator of the embodiment by this invention. The match loop counter 600 that counts the number of repeated VERIFY is arranged in the sequence control section 11 as shown in FIG. 3. The BAR register 800 that stores a branch address when the VERIFY count exceeds a predetermined limit is arranged. The MJP register 700 that stores an address branched from the sequencer 113 when the match signal is found is arranged. Then, the selector 414 that loads the output data from the MJP and BAR registers to the sequencer 113 is arranged.

In the second embodiment, as described in detail below, when the match signal is "1," the pipeline initialization is performed by taking advantage of a waiting time, called DURATION for completing the verification after writing. When the match is 0, the testing is designed to speed up by not performing the pipeline initialization.

FIG. 12 is a detailed flowchart of the flash memory testing. As shown in FIG. 12, before and after WRITE PROGRAM VERIFY COMMAND, the waiting time DURATION, which is a few μsec to several ten of μsec, is required. Note that each cycle of WRITE PROGRAM COMMAND, WRITE PROGRAM, WRITE PROGRAM VERIFY COMMAND, and VERIFY operates in 100 μsec or so.

The operation is explained as follows:

(1) Firstly, the initial address is set, and each command of WRITE PROGRAM COMMAND, WRITE PROGRAM, DURATION, WRITE PROGRAM VERIFY COMMAND, DURATION, and VERIFY is executed. Here, the duration cycle is operated approximately at the minimum rate of the system. For example, if DURATION is 10 μsec and the system minimum rate is 20 nanosecond, it is set so as to loop 500 cycles.

(2) The pattern generator advances to a loop where the VERIFY result is FAIL and VERIFY limit is NO in the sequence in FIG. 12 and executes in sequence regardless whether the match signal is "1" or "0."

(3) As long as the match is not found, the above operation is repeated. When it exceeds the VERIFY limit, the data of the BAR register 800 is loaded to the selector 414 via the sequencer 113 and the pattern generator is completed as FAIL STOP.

(4) When the match is found, the following operation is performed:

When the match signal enters the decode section 112, the data of the MJP register 700 is loaded into the sequencer 113 via the selector 414. At this instance, the match loop counter 600 is initialized at the same time.

(A) If the loop counter 116 is not zero, i.e. the test address is not the final address, operand data is loaded into the sequencer 113 and a series of PROGRAM/VERIFY sequence is generated continuously. At this moment, the address signal is incremented by the address generator 13.

(B) If the loop counter 116 is zero, i.e. the test address is the final address, the sequencer 113 is incremented by one and the pattern generator is completed as PASS STOP.

(5) As mentioned above, when the match is found, the sequence is changed. Hence, the pipeline in the pattern generator must be refilled. In this case, it takes a few hundred (nanosecond) at best for the match signal to return from the logical comparator 4 to the normal VERIFY cycle after the pattern is generated from the pattern generator. Therefore, as the match signal is during the DURATION cycle, the pipeline can be refilled using the system clock for DURATION through the OR gate 17. For example, if the system rate is 32 nsec and DURATION is 2 μsec, the DURATION cycle is greater than 60 cycles. While the number of the pipeline stages in the pattern generator are several dozens at most. Hence, it is possible to refill the pipeline using the system clock for DURATION.

Figure 4:
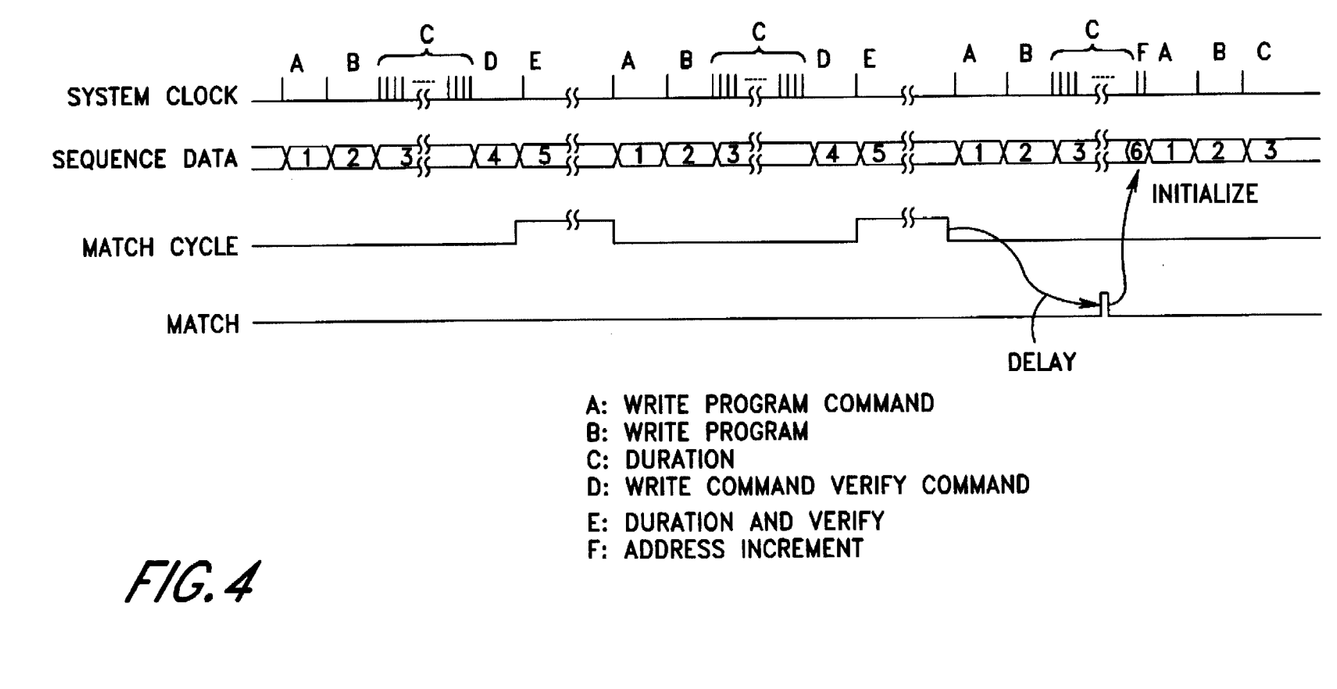
FIG. 4 is a timing chart by the second embodiment of this invention.

FIG. 4 illustrates the timing chart of the second embodiment of this invention. In accordance with the second embodiment, when the match is not found in testing flash memory and the like, the next command execution advances without waiting the VERIFY result, and the pipeline initialization is not performed. Hence, the testing can be shortened. Furthermore, when the match is found, the pipeline initialization is performed using the system clock for the DURATION cycle. Note that the match restart signal that is provided from the timing generator 6 to the start/stop control section 16 becomes unnecessary and is not used. Hence, it becomes simpler in composition in comparison with the conventional system.

As each embodiment is composed as mentioned above, it has the following effects. It could realize a high speed pattern generator that can test a device to be measured, such as flash memory where multiple operations for writing and erasing are required, the number of operations are not constant and the test flow varies.

I claim:

1. A high speed pattern generator for generating a test pattern and an expected data pattern wherein the test pattern is applied to an electronic device to be tested and the resulted output of the electronics device is compared with the expected data pattern by a comparator, said pattern generator comprising:

an address generator (13) for generating address data of said test pattern, said address generator including a pipeline having a plurality of sequential stages wherein a plurality of instructions are executed in said sequential stages at the same time;

an operation control memory (12) that stores a part of said instructions to be processed in said address generator (13);

a save register (300) that stores branch destination data in a sequence control section (11) in response to a match signal from the comparator (4), said sequence control section accesses said operation control memory to read said instructions; and an inhibit gate (500) that prevents an initial clock generator (161) from generating an initial clock for driving said pipeline in said address generator to fill in commands in said plurality of sequential stages in response to the match signal.

2. The high speed pattern generator of claim 1, wherein the save register (300) stores data output by an incrementer (200) that increments output match data from a sequencer (113) by one and provides the stored data to a selector (414) that selects data which is loaded into the sequencer (113).

3. The high speed pattern generator of claims 1 or 2, wherein a match restart signal from a timing generator (6) is applied to an input terminal of the inhibit gate (500) and the match signal is applied to the other input terminal of said inhibit gate (500), the inhibit gate (500) being an AND gate (500) that provides the output to said initial clock generator (161).

4. A high speed pattern generator which generates a test pattern for testing a memory device, comprising:

a match loop counter (600), in a sequence control section (11) which outputs data to an operation control memory (12), that counts the number of times for comparing an output of said memory device with expected data when a match signal from a logical comparator (4) indicates negative;

a first register (800) that stores a branch address when said number exceeds a predetermined limit, a second register (700) that stores an address for a sequencer (113) to be branched when the match signal from the logical comparator (4) indicates affirmative; and a selector (414) that selectively loads the output data from each of said first and second registers (700, 800) to the sequencer (113).

5. The high speed pattern generator of claim 4 wherein when the match signal from the logical comparator (4) is either negative or affirmative, an operation of refilling a pipeline structure of each operation section in the pattern generator (1) is carried out by supplying a system clock (17) to said pipeline.

* * * * *